United States Patent [19]
Liu

[11] Patent Number: 5,701,578
[45] Date of Patent: Dec. 23, 1997

[54] METHOD FOR MAKING A DIAMOND-COATED MEMBER

[75] Inventor: Yixiong Liu, Latrobe, Pa.

[73] Assignee: Kennametal Inc., Latrobe, Pa.

[21] Appl. No.: 752,097

[22] Filed: Nov. 20, 1996

[51] Int. Cl.$^6$ ...................................................... B22F 7/08
[52] U.S. Cl. .......................... 428/565; 428/408; 428/698; 428/665; 75/240; 75/242; 51/307; 51/309; 427/585; 419/29; 419/53; 419/55
[58] Field of Search ...................................... 428/546, 698, 428/565, 408, 665; 51/307, 309; 75/240, 242; 419/29, 53, 55; 427/585

[56] References Cited

U.S. PATENT DOCUMENTS

| | | | |
|---|---|---|---|
| 4,556,424 | 12/1985 | Viswanadham | 75/240 |
| 4,731,296 | 3/1988 | Kikuchi et al. | 428/552 |
| 5,066,553 | 11/1991 | Yoshimura et al. | 428/698 |
| 5,068,148 | 11/1991 | Nakahara et al. | 428/335 |
| 5,100,703 | 3/1992 | Saijo et al. | 427/249 |
| 5,370,944 | 12/1994 | Omori et al. | 428/565 |
| 5,451,430 | 9/1995 | Anthony et al. | 427/372.2 |
| 5,513,447 | 5/1996 | Yoshida | 34/491 |
| 5,514,313 | 5/1996 | Yoshida | 264/57 |

FOREIGN PATENT DOCUMENTS

WO95/15258   6/1995   WIPO .

OTHER PUBLICATIONS

Hosomi, Satoru et al., "Diamond CVD Researches as Patent Applied," Proceedings of Auburn University Conference, Aug. 1991, pp. 15–24.

Primary Examiner—Ngoclan Mai
Attorney, Agent, or Firm—John J. Prizzi

[57] ABSTRACT

A method of making a coated member comprising the steps of: providing a sintered substrate that includes hard grains bonded together by metallic binder; removing material from the sintered substrate to form an as-ground substrate; reducing the residual stresses in the substrate; resintering the substrate to form a resintered substrate; and adherently depositing a coating on the resintered substrate.

18 Claims, 1 Drawing Sheet

METHOD FOR MAKING A DIAMOND-COATED MEMBER

GOVERNMENT CONTRACT

The invention described herein was made during the course of, or in the performance of, work under the United States Government Advanced Technology Program (ATP) Grant No. 70NANB5H1084, under the auspices of the Department of Commerce.

BACKGROUND

Members, such as, for example drills, endmills, reamers, and seal rings typically must have consistent dimensional integrity and meet tight dimensional tolerances. This is true because the typical application to which these members are put requires high dimensional accuracy to achieve acceptable performance.

Because a chemical vapor deposition (CVD) diamond coating offers particularly advantageous performance properties, the application of an adherent CVD diamond coating to a member should provide a member with excellent characteristics. However, there has been at least one drawback with the application of a CVD diamond coating to the substrate; namely, the inability to consistently maintain the dimensional integrity of certain substrate geometries prior to the application of the CVD diamond coating. This results in a failure to consistently produce diamond-coated, tight tolerance members that have dimensional integrity. One consequence, for example, is the inability to use an elongate cutting member to consistently drill holes to a high dimensional accuracy.

Referring to a heretofore used process for making a diamond coated member, as described in Published International Patent Application No. PCT/US94/02346 (International Publication No. WO95/15258), for DIAMOND COATED TOOLS AND METHOD FOR MAKING (assigned to Kennametal Inc., of Latrobe, Pa. 15650, U.S.A.), which is hereby incorporated by reference herein, the first step comprises forming a green body of a partial density from a homogeneous mixture of powder components. The next step comprises consolidating the green body under heat or heat and pressure (e.g., sintering such as, for example, vacuum sintering, pressure sintering or hot isostatic pressing) to form a consolidated or sintered substrate with full density.

The next step may comprise grinding, i.e., removing material from, the sintered substrate so as to define the structural features of the elongate cutting member. In the case of a tungsten carbide-cobalt alloy, grinding typically smears cobalt on the surface of the as-ground sintered substrate which adds to the surface cobalt already present due to the wettability of the tungsten carbide by the cobalt under vacuum sintering conditions.

In order to reduce or remove the cobalt from the surface and to produce sufficiently large tungsten carbide grains at the surface of the substrate, the next step comprises resintering the as-ground substrate. International Patent Application No. PCT/US94/02346 describes a resintering process in which the resintering results in a surface with a lower cobalt content and an increased substrate surface roughness. More specifically, the substrate is resintered under time, temperature and atmospheric conditions so as to cause grain growth and binder evaporation from the surface of the substrate. The time and temperature are selected so that sufficient abnormal or exaggerated grain growth occurs on the surface of the substrate to achieve a surface roughness, $R_a$, of greater than 25 microinches, $R_a$, preferably greater than 30 microinches, $R_a$, and most preferably at least 40 microinches, $R_a$.

For a tungsten carbide-cobalt composition, the resintering may be performed at 2750° F. (1510° C.) for two to three hours in about 0.5 torr nitrogen atmosphere. The sintering time will depend upon the composition of the substrate and the resintering conditions. It is typically the case that as the sintering temperature increases the sintering time decreases. If the surface roughness is not sufficient after the first resintering, the substrate may be subjected to a subsequent resintering.

The nitrogen partial pressure should be controlled so as to allow the cobalt to evaporate from the surface of the substrate. Yet, there should be a minimal re-wetting of the surface of the substrate by cobalt from the bulk region of the substrate while avoiding any noticeable formation of a nitride layer on the substrate surface. It is typical that the selected nitrogen partial pressure is between 0.3 torr and 5 torr.

In the case of the as-ground substrate for an elongate cutting member like a drill, the applicant has found that the as-ground substrate experiences dimensional distortion upon resintering. He believes that one factor that aggravates the distortion has to do with the residual stresses caused during the grinding operation. More specifically, the grinding of the sintered substrate introduces residual stresses to the as-ground substrate. These residual stresses then aggravate the dimensional distortion of the substrate upon resintering at a temperature above the liquidus.

There is another factor that contributes to the dimensional distortion upon resintering; namely, the absence of an adequate cross-section of material in the as-ground substrate which thereby reduces the stiffness of the substrate during resintering. This is especially true for high aspect ratio substrates wherein the part is more easily distorted during high temperature liquid phase resintering. A high aspect ratio substrate is one wherein the ratio of the major dimension (e.g., the length or the diameter depending upon the geometry of the substrate) to the minor dimension (e.g., the diameter or the thickness, respectively) is high such as, for example, greater than 10:1. Pending U.S. patent application Ser. No. 08/648,603, filed on May 15, 1996, for a DIAMOND COATED CUTTING MEMBER AND METHOD OF MAKING THE SAME (assigned to Kennametal Inc. of Latrobe, Pa. 15650, U.S.A.) addresses dimensional distortion upon resintering. U.S. patent application Ser. No. 08/648,603 is hereby incorporated by reference herein.

The resintered substrate is then coated with diamond using CVD techniques to form a diamond-coated elongate cutting member. In the application of the diamond coating, it is preferred that the substrate temperature during coating be maintained between 700° C. and 875° C. If the temperature is below 700° C., too much graphite forms in the diamond coating which significantly reduces the wear resistance. At a temperature below 700° C., there is a reduction in the deposition rate of the coating. If the temperature is above 875° C., too much cobalt diffuses from the substrate during the coating operation so as to adversely affect the adhesion of the coating to the substrate.

As mentioned above, these diamond-coated high aspect ratio members may have significant dimensional distortion because the substrate underwent dimensional distortion during resintering. Dimensional distortion in a diamond-coated elongate cutting member, for example, is an undesirable characteristic. It would thus be very desirable to provide a method of making a diamond-coated member, as well as the member itself, wherein the diamond-coated member exhibits a high degree of dimensional integrity along with an adherent CVD diamond coating.

SUMMARY

It is an object of the invention to provide a method of making a diamond coated member, as well as the member itself, wherein the member exhibits high degree of dimensional integrity along with an adherent diamond coating.

In one form thereof, the invention is a method of making a coated member comprising the steps of: providing a sintered substrate that includes hard grains bonded together by metallic binder; removing material from the sintered substrate to form an as-ground substrate; reducing the residual stresses in the substrate; resintering the substrate to form a resintered substrate; and adherently depositing a coating on the resintered substrate.

BRIEF DESCRIPTION OF THE DRAWINGS

The following is a brief description of the drawings which form a part of this patent application.

DETAILED DESCRIPTION

Figure 1:
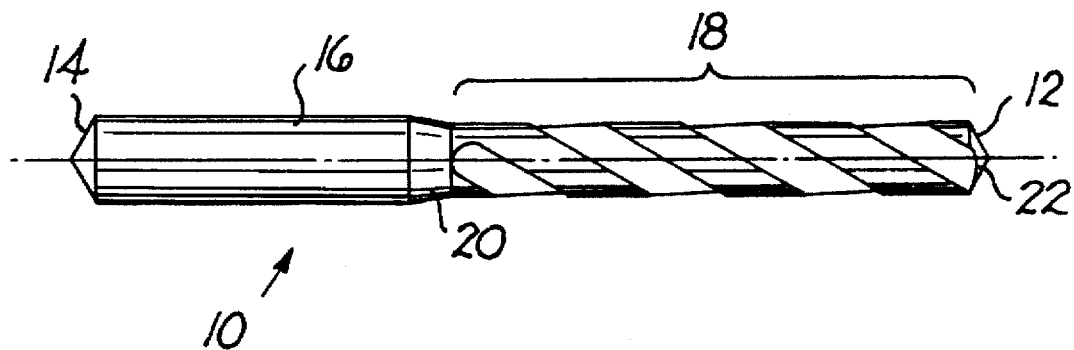
FIG. 1 is a side view of a twist drill with a diamond coating.

FIG. 1 illustrates a twist drill 10 which has an axially forward end 12 and an axially rearward end 14. Twist drill 10 has a rearward shank 16 which presents a relatively constant diameter. Twist drill 10 has a fluted portion 18. Twist drill 10 also has at least one cutting edge 22 at the axially forward end 12 thereof. A shoulder 20, which has a frusto-conical shape, provides the transition between the fluted portion 18 and the rearward shank 16. The diameter of the rearward shank 16 is larger than the diameter of the fluted portion 18. Twist drill 10 has an adherent diamond coating on its cutting edge 22 and on at least a portion of the fluted portion 18.

Figure 2:
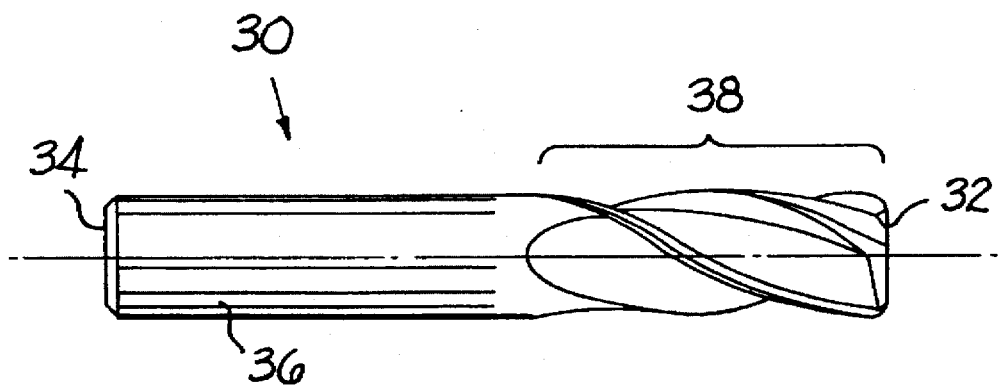
FIG. 2 is a side view of an end mill with a diamond coating.

FIG. 2 illustrates an end mill 30 which has an axially forward end 32 and an axially rearward end 34. End mill 30 also has a rearward shank 36. End mill 30 also has a fluted portion 38. End mill 30 has an adherent diamond coating on its cutting edges and on areas adjacent to them.

The twist drill and the end mill are representative, but not all inclusive, of high aspect ratio members to which this invention pertains. In this regard, the invention includes other high aspect ratio member such as, for example, reamers, taps, routers, borers, end mills, thread cutting end mills, and seal rings.

Referring to the method of making the twist drill and the end mill, the first step comprises providing a mixture of powder components that form the composition of the substrate. Typically, these components are blended by ball milling or the like into a homogeneous powder mixture. These powder components typically comprise hard grains (e.g., tungsten carbide) and a metallic binder (e.g., cobalt).

The powder blend is then formed into a green body of an elongate shape. The green body has a partial density. The typical forming process comprises extrusion.

The green body is then consolidated under heat or heat and pressure to form a substrate of full density. Exemplary consolidation processes involving liquid phase sintering include vacuum sintering, pressure sintering, and hot isostatic pressing. In the case of a twist drill made from a tungsten carbide-cobalt composition, the consolidation process may comprise liquid phase vacuum sintering at a temperature of about 2750° F. (1510° C.) for a duration of about three hours. The result is the formation of a generally cylindrical sintered substrate blank for the twist drill. Cobalt is typically present at the surface of the sintered substrate due to the wettability of the tungsten carbide by the cobalt.

In the case of the twist drill, the next step is to grind the sintered substrate to form the flutes, the cutting edges, and other structural features of the twist drill. It is during the grinding that cobalt is smeared across the surface of the as-ground substrate. The grinding step also introduces residual stresses into the as-ground substrate. After completion of the grinding process, the as-ground substrate has a surface with excessive cobalt thereon due to the grinding as well as the wettability of the tungsten carbide by the cobalt.

In order to eliminate, or at least reduce, the residual stresses in the as-ground substrate, the as-ground substrate is preferably subjected to an annealing step. In the annealing step, the as-ground substrate is preferably heated to a temperature of about 850° C. (1562° F.) and held thereat for about two hours. Other temperatures and times of the annealing may be used so long as residual stresses are reduced, preferably without producing a change in the microstructure. The preferable temperatures for the annealing are believed to be below the liquid phase sintering temperature.

In order to remove or reduce the surface cobalt and roughen the surface of the substrate, the annealed substrate is subjected to resintering according to the teachings of International Patent Application No. PCT/US94/02346. The resintering causes the cobalt to evaporate from the surface of the substrate. The resintering also coarsens the grain size of the tungsten carbide grains at the surface of the substrate so as to roughen the substrate surface. The substrate preferably has a surface roughness of greater than 25 microinches, $R_a$, and more preferably greater than 30 microinches, $R_a$, and most preferably at least 40 microinches, $R_a$.

The resintered substrate is then CVD coated with diamond according to the teachings of International Patent Application No. PCT/US94/02346, or any other known CVD diamond coating technology that provides adequate coating adhesion.

In order to demonstrate the improvement in the dimensional integrity of the diamond-coated twist drills made according to the method of the present invention, the twist drill of the invention, which included the annealing step, were compared to twist drills made by a method that did not have the annealing step therein. The specific style of twist drill was a 8.5 mm diameter TF drill made by Kennametal Hertel AG, of Fürth, Germany. This design has a shank diameter of 10 mm, a shank length of 40 mm, and an overall length of 103 mm. This twist drill has three cutting edges and three flutes. This twist drill has a wall thickness between flutes of about 1.5 mm. The aspect ratio of this drill is, therefore, 103/1.5, or about 69.

More specifically, the twist drills of the invention were subjected to the following heat treatments sintering at 1510° C. for three hours; annealing at a temperature of 850° C. for two hours; and resintering at a temperature of 1510° C. for three hours. The comparative twist drills were subjected to the following heat treatments: sintering at 1510° C. for a duration of three hours and resintering at a temperature of 1510° C. for three hours. The drills were hung vertically in the furnace (cutting edge down) during the annealing and resintering treatments.

Tests to determine the run-out tolerance for the twist drills (see ANSI Y14.5M-1982, Dimensioning and Tolerancing, publishing by The American Society of Mechanical Engineers, New York, N.Y.) were conducted on these twist drills. The results of the run-out tests are set forth in the Table I below.

TABLE I

Run-Out Test Results for Twist Drills

| Sample | Run-Out After Anneal, but Before Resinter (μm) | Run-Out After Resinter (μm) |
|---|---|---|
| Example 1 | 15 | 147 |
| Comparative Example 1 | N/A | 482 |
| Example 2 | 124 | 1160 |
| Comparative Example 2 | N/A | 2022 |

The initial sintered composition of Example 1 and Comparative Example 1 is: about 2.6 weight percent cobalt, up to about 0.4 weight percent tantalum, up to about 0.1 weight percent titanium, up to about 0.1 weight percent niobium, and the balance tungsten and carbon wherein most of the tungsten and carbon is in the form of tungsten carbide and the other elements, if any, may (with tungsten) form solid solution carbides. The initial sintered composition of Example 2 and Comparative Example 2 is about 6 weight percent cobalt, up to about 0.1 weight percent tantalum, up to about 0.1 weight percent titanium, up to about 0.1 weight percent niobium, about 0.2 weight percent vanadium, and the balance tungsten and carbon wherein most of the tungsten and carbon is in the form of tungsten carbide and the other elements, if any, may form solid solution carbides with tungsten.

The test results show that in the lower cobalt grade (2.6 weight percent cobalt) the reduction in the run-out due to the anneal was about 70 percent. More specifically, the run-out was reduced from 482 to 147. In the higher cobalt grade (6 weight percent cobalt), the reduction in the run-out was about 40 percent. More specifically, the run-out was reduced from 2022 to 1160.

These test results show very clearly that the use of an annealing step significantly reduced the run-out. This means that the use of the annealing step significantly reduced the dimensional distortion in the diamond-coated twist drills which were produced according to the method that used the annealing step as compared to the earlier method that did not use the annealing step.

Tests were also conducted to determine if the heating rate of the as-ground substrate from room temperature to the annealing temperature, and if the cooling rate from the annealing temperature to the room temperature, had an impact upon the reduction of the dimensional distortion of the twist drills measured after annealing. The same style of twist drills as used above, a 8.5 mm diameter TF drill, were made according to the above method using the annealing step, but for one drill the heating rate from room temperature to the annealing temperature of 850° C. and the cooling rate from the annealing temperature of 850° C. to room temperature was at least 10° F. per minute and for the other drill the heating and cooling rate was at about 2° F. per minute. The twist drills were tested in Composition No. 1 and Composition No 2. The results are presented in Table II below.

TABLE II

Run-Out Test Results for Twist Drills for Different Heating and Cooling Rates

| Composition No./Example | Heating & Cooling Rate (°F. per minute) | Run-Out Before Anneal (μm) | Run-Out After Anneal (μm) |
|---|---|---|---|
| 1 (Ex. 1) | ≧10 | 0 | 15 |
| 1 (Ex. 3) | ~2 | 1 | 8 |
| 1 (Ex. 4) | ~2 | 1 | 4 |
| 2 (Ex. 2) | ≧10 | 0 | 124 |
| 2 (Ex. 5) | ~2 | 0 | 18 |
| 2 (Ex. 6) | ~2 | 1 | 1 |

Although the heating and cooling rate varied, the annealing step comprised a hold for two hours at a temperature of 850° C. The run-out measurement had an error of ±1 μm.

The above tests, in which the heating and cooling rates were varied, shows that a slower heating rate from room temperature up to the annealing temperature and/or a slower cooling rate down from the annealing temperature to room temperature produced a twist drill with less dimensional distortion as measured by the run-out. In this regard, for the lower cobalt (2.6 weight percent) grade, Composition No. 1, the improvement due to the use of a slower heating and cooling rate was a reduction in the run-out of between about 25 percent and about 50 percent. For the higher cobalt (6 weight percent) grade, Composition No. 2, the improvement due to the use of a slower heating and cooling rate was a reduction in the run-out of between about 85 percent and about 99 percent. Although the above-mentioned heating and cooling rates were to and from room temperature, it is expected that slower heating and/or cooling rates, even if not from or to room temperature, would result is a reduction in the run-out, and hence, an improvement in the dimensional integrity of the elongate cutting member.

It is expected that slow cooling rates, even without a slow heating rate, will provide most, if not all, the improvements observed above.

It should be appreciated that while the above description describes the annealing as a separate step from the resintering step, the inventor contemplates that the annealing step and resintering steps could be combined into one step. In this regard, the annealing treatment would be the first part of this step and the resintering would be the second part of this step. By combining the anneal and the resinter, it may be possible to increase the efficiency of the overall process while still providing the annealing treatment wherein the body is subjected to a prolonged heat treatment at the annealing temperature so as to reduce the residual stresses from grinding.

It should also be appreciated that the specific temperatures, durations and atmospheres for the heat treatments and heat up and cool down rates (i.e., the sintering, annealing, and resintering) may vary depending upon the specific compositions. However, the sintering step should consolidate the green body. The annealing step should reduce the residual stresses in the as-ground sintered substrate. The resintering step should evaporate the binder, e.g., cobalt, from, as well as roughen, the surface of the substrate.

It is preferred that a slow cooling rate (for example, 2° F./minute, or less) be used after annealing and/or resintering to assure uniform cooling of a member and the avoidance of dimensional distortion caused by nonuniform cooling and residual stresses it may reintroduce into the member. It is possible that a slow cooling rate treatment from the resintering temperature may provide sufficient distortion control to make the annealing treatment unnecessary.

All patents and other documents identified in this application are hereby incorporated by reference herein. Other embodiments of the invention will be apparent to those skilled in the art from a consideration of the specification or practice of the invention disclosed herein. It is intended that the specification and examples be considered as illustrative only, with the true scope and spirit of the invention being indicated by the following claims.

What is claimed is:

1. A method of making a coated member comprising the steps of:

providing a sintered substrate that includes hard grains bonded together by metallic binder;

removing material from the sintered substrate;

reducing the residual stresses in the substrate;

resintering the substrate to form a resintered substrate; and adherently depositing a coating on the resintered substrate.

2. The method of claim 1 wherein the reducing step comprises annealing the substrate to form an annealed substrate.

3. The method of claim 2 further including the step of heating the substrate from room temperature to the annealing temperature.

4. The method of claim 2 further including the step of cooling the annealed substrate from the annealing temperature to room temperature.

5. The method of claim 1 wherein the metallic binder comprises cobalt and the hard grains comprise tungsten carbide, and the sintered substrate comprises between about 0.2 weight percent and about 20 weight percent cobalt.

6. The method of claim 5 wherein the sintered substrate comprises between about 0.2 and about 2.9 weight percent cobalt up to about 0.4 weight percent tantalum, up to about 0.1 weight percent titanium, up to about 0.1 weight percent niobium, and the balance tungsten and carbon.

7. The method of claim 5 wherein the sintered substrate comprises between about 0.2 and about 7 weight percent cobalt, up to about 0.1 weight percent tantalum, up to about 0.1 weight percent titanium, up to about 0.1 weight percent niobium, about 0.2 weight percent vanadium, and the balance tungsten and carbon.

8. The method of claim 1 wherein the sintering step occurs at a temperature of between about 1400° C. and about 1600° C. for a duration between about two hours and about three hours.

9. The method of claim 1 wherein the resintering step occurs at a temperature of between about 1400° C. and about 1600° C. for a duration between about two hours and about three hours.

10. The method of claim 9 wherein the resintering occurs in a nitrogen atmosphere at a pressure between about 0.3 torr and about 5 torr.

11. The method of claim 1 wherein the coating step comprises the application of a diamond coating by chemical vapor deposition.

12. A coated elongate cutting tool produced by the process comprising the steps of:

providing a sintered substrate that includes hard grains bonded together by metallic binder;

removing material from the sintered substrate to form an as-ground substrate;

annealing the as-ground substrate to form an annealed substrate;

resintering the annealed substrate to form a resintered substrate; and adherently depositing a coating on the resintered substrate.

13. A method of making a coated elongate cutting tool comprising the steps of:

providing a sintered substrate that includes hard grains bonded together by metallic binder wherein some metallic binder may be at the surface of the sintered substrate;

forming an as-ground substrate by grinding the sintered substrate to define at least one structural feature of the elongate cutting tool;

forming an annealed substrate by heat treating the as-ground substrate;

forming a resintered substrate by resintering the annealed substrate so as to evaporate the metallic binder at the surface of the annealed substrate and to coarsen the size of the hard grains at the surface of the annealed substrate so that the resintered substrate has a roughened surface roughness; and adherently depositing a coating on the resintered substrate by chemical vapor deposition.

14. The method of claim 13 wherein the sintering step occurs at a temperature of between about 1400° C. and about 1600° C.

15. The method of claim 13 wherein the resintering occurs at a temperature of between about 1400° C. and about 1600° C.

16. A diamond-coated elongate member comprising:

a tungsten carbide-based cemented carbide substrate subjected to a residual stress reduction treatment;

the substrate having a surface roughness of at least 25 microinches, $R_a$;

an adherent diamond coating on the surface of the substrate; and the run-out of the substrate being at least 40 percent less than the run-out of an identical substrate not subjected to the residual stress reduction treatment.

17. The elongate cutting member of claim 16 wherein the cutting member is selected from the group consisting of reamers, taps, routers, borers, end mills, and thread cutting end mills.

18. The elongate cutting member of claim 16 wherein the substrate includes a cobalt binder.

* * * * *